United States Patent
He (10) Patent No.: US 10,585,302 B2
(45) Date of Patent: Mar. 10, 2020

(54) CURVED DISPLAY DEVICE AND MANUFACTURING METHOD THEREFOR

(71) Applicant: BOE TECHNOLOGY GROUP CO., LTD., Beijing (CN)

(72) Inventor: Fang He, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/321,953

(22) PCT Filed: May 11, 2018

(86) PCT No.: PCT/CN2018/086562
§ 371 (c)(1),
(2) Date: Jan. 30, 2019

(87) PCT Pub. No.: WO2018/214759
PCT Pub. Date: Nov. 29, 2018

(65) Prior Publication Data
US 2019/0219849 A1    Jul. 18, 2019

(30) Foreign Application Priority Data

May 24, 2017    (CN) .......................... 2017 1 0374652

(51) Int. Cl.
*G02F 1/1333*    (2006.01)
*G02F 1/1339*    (2006.01)
(Continued)

(52) U.S. Cl.
CPC .......... *G02F 1/1333* (2013.01); *G02F 1/1339* (2013.01); *G02F 1/13394* (2013.01);
(Continued)

(58) Field of Classification Search
None
See application file for complete search history.

(56) References Cited

U.S. PATENT DOCUMENTS 7,535,446 B2 * 5/2009 Booh .................... G02F 1/1333
345/87
2002/0163613 A1   11/2002 Chang et al.
(Continued)

FOREIGN PATENT DOCUMENTS

CN    104299525 A    1/2015
CN    104347009 A    2/2015
(Continued)

OTHER PUBLICATIONS

Pekka Ronkanen, Pasi Kallio, Heikki N. Koivo; Simultaneous Actuation and Force Estimation Using Piezoelectric Actuators, Proceedings of the 2007 IEEE International Conference on Mechatronics and Automation, Aug. 5-8, 2007, pp. 3261-3265.*
(Continued)

*Primary Examiner* — Ryan Crockett
(74) *Attorney, Agent, or Firm* — Dilworth & Barrese, LLP.; Michael J. Musella, Esq.

(57) ABSTRACT

Disclosed are a curved display device and a manufacturing method therefor. The curved display device includes: an array substrate and an opposite substrate arranged opposite to each other, and a liquid crystal layer located between the array substrate and the opposite substrate, wherein on a side, away from the liquid crystal layer, of the array substrate and/or the opposite substrate, a plurality of piezoelectric sensors parallel to each other and a piezoelectric control chip in electrical signal connection with the piezoelectric sensors are respectively provided.

15 Claims, 4 Drawing Sheets

(51) Int. Cl.
  *G02F 1/1335* (2006.01)
  *H01L 41/113* (2006.01)
  *G06F 3/01* (2006.01)
  *H01L 27/20* (2006.01)
  *H01L 41/04* (2006.01)

(52) U.S. Cl.
  CPC .. *G02F 1/133305* (2013.01); *G02F 1/133516* (2013.01); *G06F 3/01* (2013.01); *H01L 27/20* (2013.01); *H01L 41/1132* (2013.01); *G02F 2001/13396* (2013.01); *G02F 2001/133354* (2013.01); *G02F 2001/133394* (2013.01); *H01L 41/042* (2013.01)

(56) References Cited

U.S. PATENT DOCUMENTS

| | | | |
|---|---|---|---|
| 2006/0109391 A1* | 5/2006 | Huitema | G09G 3/3611 349/19 |
| 2012/0304341 A1* | 11/2012 | Polesel | G01Q 10/06 850/5 |
| 2015/0036077 A1 | 2/2015 | Lee et al. | |
| 2016/0291384 A1 | 10/2016 | Shao et al. | |
| 2017/0016724 A1* | 1/2017 | Sakai | G01C 19/5614 |
| 2017/0205644 A1 | 7/2017 | Wang et al. | |
| 2017/0205648 A1* | 7/2017 | Xie | G02F 1/133345 |
| 2017/0205923 A1* | 7/2017 | Shim | G06F 3/0412 |
| 2017/0212373 A1* | 7/2017 | Sai | G02F 1/1339 |
| 2019/0095015 A1* | 3/2019 | Han | H01L 27/1214 |
| 2019/0163234 A1* | 5/2019 | Kim | H04R 17/00 |
| 2019/0214545 A1* | 7/2019 | Van De Molengraaf | H01L 41/042 |

FOREIGN PATENT DOCUMENTS

| | | |
|---|---|---|
| CN | 104766870 A | 7/2015 |
| CN | 105278175 A | 1/2016 |
| CN | 105652528 A | 6/2016 |
| CN | 105911774 A | 8/2016 |
| CN | 105929577 A | 9/2016 |
| CN | 106950742 A | 7/2017 |

OTHER PUBLICATIONS

International Search Report and Written Opinion dated Aug. 8, 2018.

* cited by examiner

CURVED DISPLAY DEVICE AND MANUFACTURING METHOD THEREFOR

The present application claims the benefits of Chinese patent application No. 201710374652.5 filed on May 24, 2017, and the contents of the above-mentioned Chinese patent application is fully incorporated herein by reference as part of this application.

TECHNICAL FIELD

Embodiments of the present disclosure relate to a curved display device and a manufacturing method thereof.

BACKGROUND

Liquid crystal display (LCD) that possesses advantages such as small size, low power consumption and no radiation has been rapidly developed in recent years, and has dominated the current market of flat-panel displays (FPDs). At present, LCD is widely applied in various products with large, middle and small sizes, which nearly covers the main electronic products in today's information society, for example, LCD TV, high definition digital TV, computer (including desktop computer and notebook computer), mobile phone, vehicle-mounted display, projected display, video camera, digital camera, electronic watch, calculator, electronic instrument, gauge, public display, virtual display and the like.

SUMMARY

Embodiments of the present disclosure provide a curved display device and a manufacturing method thereof, which are intended to solve the problem existed in the known technology that the thickness of the liquid crystal layer in the curved display device is non-uniform.

Embodiments of the present disclosure provide a curved display device, including an array substrate and an opposed substrate disposed opposite to each other; and a liquid crystal (LC) layer located between the array substrate and the opposed substrate, wherein, one side of at least one of the array substrate and the opposed substrate farther from the LC layer is provided with a plurality of strip-shaped piezoelectric sensors parallel to each other and a piezoelectric control chip electrically signal connected with each of the piezoelectric sensors; a display region of the curved display device comprises: two curved first edges and two second edges extending along a straight line direction; an extending direction of each of the piezoelectric sensors is the same as an extending direction of the second edges; the piezoelectric control chip is configured to detect a voltage value of each of the piezoelectric sensors and to apply an offset voltage onto each of the piezoelectric sensors according to the voltage value of each of the piezoelectric sensors as detected, so that the piezoelectric sensors have a same voltage value.

In the curved display device provided by the embodiment of the present disclosure, the piezoelectric sensor includes: a piezoelectric film; and a grounding electrode and a voltage control electrode which are located at a same layer with the piezoelectric film and are located at two sides of the piezoelectric film, respectively; the grounding electrode of each of the piezoelectric sensors is grounded, and the voltage control electrode of each of the piezoelectric sensors is electrically signal connected to the voltage control chip.

In the curved display device provided by the embodiment of the present disclosure, the curved display device is curved towards a side where the opposed substrate is located; the offset voltage corresponding to the piezoelectric sensors located on the array substrate is gradually increased in a direction from a center to an edge of the curved display device; and the offset voltage corresponding to the piezoelectric sensors located on the opposed substrate is gradually decreased in the direction from the center to the edge of the curved display device.

In the curved display device provided by the embodiment of the present disclosure, the curved display device is curved towards a side where the array substrate is located; the offset voltage corresponding to the piezoelectric sensors located on the array substrate is gradually decreased in a direction from a center to an edge of the curved display device; and the offset voltage corresponding to the piezoelectric sensors located on the opposed substrate is gradually increased in the direction from the center to the edge of the curved display device.

In the curved display device provided by the embodiment of the present disclosure, it further includes a plurality of spacers located between the array substrate and the opposed substrate; in the extending direction of the second edge, the spacers have a same height; and in a direction perpendicular to the extending direction of the second edge, the height of the spacers is gradually decreased in a direction from a center to an edge of the curved display device.

In the curved display device provided by the embodiment of the present disclosure, the array substrate or the opposed substrate includes: a color filter (CF) layer including sub-pixel color resistances of at least three colors; and a black matrix (BM) configured to separate the sub-pixel color resistances; the piezoelectric sensors and the spacers are in an area where the BM is located; and the spacers are consisted of sub-pixel color resistances of different colors.

Embodiments of the present disclosure further provide a manufacturing method of the above-mentioned curved display device, including: on at least one of an array substrate and an opposed substrate, forming a plurality of strip-shaped piezoelectric sensors parallel to each other and a piezoelectric control chip electrically signal connected with each of the piezoelectric sensors; assembling the array substrate with the opposed substrate to form a cell, and injecting a liquid crystal (LC) layer between the array substrate and the opposed substrate; curving the array substrate and the opposed substrate assembled, to form a curved display device; and controlling the piezoelectric control chip to detect a voltage value of each of the piezoelectric sensors, and applying an offset voltage onto each of the piezoelectric sensors according to the voltage value of each of the piezoelectric sensors as detected, so that the piezoelectric sensors have a same voltage value.

In the above-mentioned manufacturing method provided by the embodiment of the present disclosure, before assembling the array substrate with the opposed substrate to form a cell, it further includes: forming a plurality of spacers at a side of the array substrate or the opposed substrate away from the piezoelectric sensors, wherein in an extending direction of a second edge of the curved display device to be formed, the spacers have a same height; and in a direction perpendicular to the extending direction of the second edge of the curved display device to be formed, the height of the spacer is gradually decreased in a direction from a center to an edge of the curved display device.

In the above-mentioned manufacturing method provided by the embodiment of the present disclosure, before forming a plurality of spacers on the array substrate or the opposed substrate, it further includes: forming a color filter (CF) layer consisted of sub-pixel color resistances of at least three colors and a black matrix (BM) configured to separate the sub-pixel color resistances, on the array substrate or the opposed substrate.

In the above-mentioned manufacturing method provided by the embodiment of the present disclosure, the CF layer includes a first sub-pixel color resistance, a second sub-pixel color resistance and a third sub-pixel color resistance; forming a plurality of spacers on the array substrate or the opposed substrate particularly includes: forming a first convex structure on the BM by using a process the same as that of the first sub-pixel color resistance; forming a second convex structure on the first convex structure by using a process the same as that of the second sub-pixel color resistance; and forming a support structure on the second convex structure by using a process the same as that of the third sub-pixel color resistance, wherein in the direction perpendicular to the extending direction of the second edge of the curved display device to be formed, a distance from the support structure to a center of a corresponding second convex structure is increased with an increase of a distance from the spacer to the center of the curved display device.

BRIEF DESCRIPTION OF THE DRAWINGS

Hereinafter, the drawings accompanying embodiments of the present disclosure are simply introduced in order to more clearly explain technical solution(s) of the embodiments of the present disclosure. Obviously, the described drawings below are merely related to some of the embodiments of the present disclosure without constituting any limitation thereto.

Reference numerals: 11—array substrate; 12—opposed substrate; 13—liquid crystal (LC) layer; 14—piezoelectric sensor; 141—piezoelectric film; 142—grounding electrode; 143—voltage control electrode; 15—piezoelectric control chip; 16—display region; 161—first edge; 162—second edge; 17—spacer; 171—first convex structure; 172—second convex structure; 173—support structure; 18—sub-pixel color resistance; 19—black matrix (BM).

DETAILED DESCRIPTION

In order to make objects, technical details and advantages of the embodiments of the invention apparent, technical solutions according to the embodiments of the present invention will be described clearly and completely as below in conjunction with the accompanying drawings of embodiments of the present invention. Apparently, the described embodiments are only a part of but not all of exemplary embodiments of the present invention. Based on the described embodiments of the present invention, various other embodiments can be obtained by those of ordinary skill in the art without creative labor and those embodiments shall fall into the protection scope of the present invention.

Liquid crystal display (LCD) achieves displaying function by controlling a luminous flux through using liquid crystals as a light valve. The control of the light by the liquid crystals under an effect of electric field is related to a thickness of LC layer. In order to achieve better displaying effect, it's very important to maintain a uniform thickness of the LC cell. At present, it usually maintains the uniform thickness of the LC cell by utilizing cylindrical spacers which are uniformly distributed in a black matrix (BM) area of a color filter (CF) substrate and corresponding to thin film transistors (TFTs) on a lower substrate.

Figure 1A:
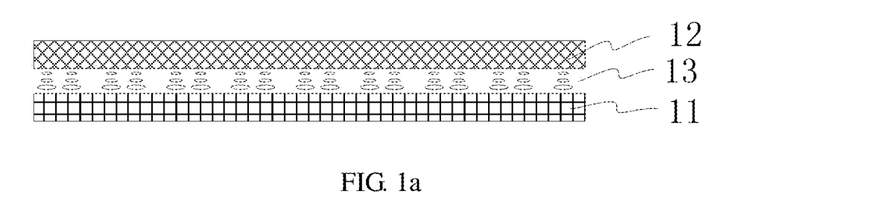
FIG. 1a-FIG. 1C are structural diagrams illustrating a curved display device after and before being curved.
Figure 1B:
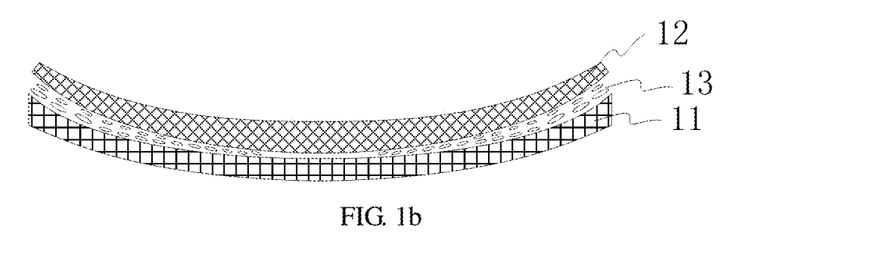
Figure 2A:
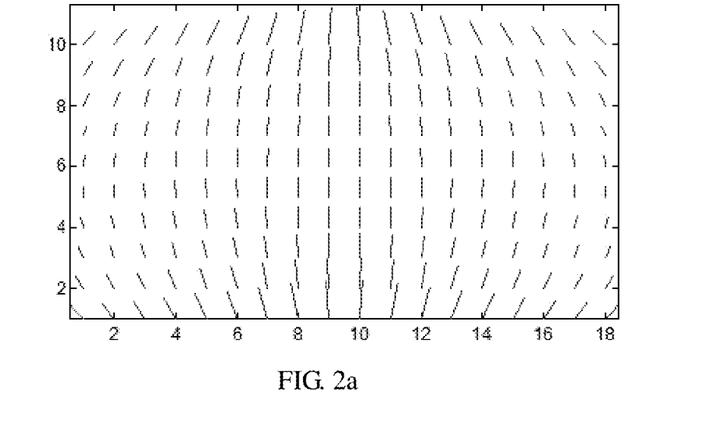
FIG. 2a and FIG. 2b are schematic diagrams illustrating optical retardation distributions at different positions on an opposed substrate and an array substrate, respectively, in the structure illustrated in FIG. 1b.
Figure 2B:
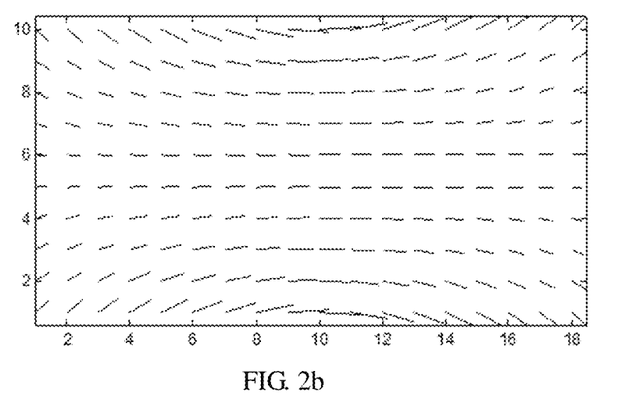

In a curved LCD, a substrate upon being curved may have different cell thickness at different position because a central position and an edge of the substrate are subjected to different stresses during curving; that is, the thickness of the LC layer 13 is uneven. FIG. 1a represents a LCD component before being curved, FIG. 1b represents a LCD component after being curved and illustrates the case of being curved towards the side where the opposed substrate 12 is located by way of example. As it can be seen from FIG. 1a and FIG. 1b, obviously, upon being curved, the LC layer 13 of the LCD component is relatively thinner in the middle and relatively thicker at both sides, because the middle position of the display panel is subjected to a maximum stress and has a maximum deformation amount, resulting in a decreased cell thickness, while the position of the display panel far away from the middle position is subjected a minimum stress and has a minimum deformation amount, resulting in an increased cell thickness; that is, the cell thickness is successively increased from the middle position to the edge position. FIG. 2a is a schematic diagram illustrating an optical retardation distribution at different positions on the opposed substrate 12, and FIG. 2b is a schematic diagram illustrating an optical retardation distribution at different positions on the array substrate 11. Because the optical retardation=stress*SOC*thickness, as it can be seen from FIG. 2a and FIG. 2b, an uneven cell thickness results in an uneven optical retardation distribution, and hence results in an uneven brightness of the LCD component, which leads to a color deviation and affects the displaying effect.

Figure 3:
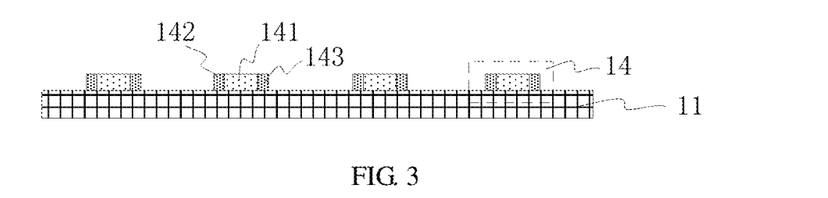
FIG. 3 is a structural diagram illustrating piezoelectric sensors disposed on an array substrate.

Embodiments of the present disclosure provide a curved display device. As illustrated in FIG. 3, the curved display device includes: an array substrate 11 and an opposed substrate 12 opposite to each other; and a liquid crystal (LC) layer 13 located between the array substrate 11 and the opposed substrate 12.

In the embodiment, one side of at least one of the array substrate 11 and the opposed substrate 12 away from the LC layer 13 is provided with a plurality of strip-shaped piezoelectric sensors 14 parallel to each other and a piezoelectric control chip 15 electrically signal connected with each of the piezoelectric sensors 14.

A display region 16 of the curved display device includes: two curved first edges 161 and two second edges 162 extending along a straight line direction; an extending direction of each of the piezoelectric sensors 14 is the same as an extending direction of the second edge 162.

The piezoelectric control chip 15 is configured to detect a voltage value of each of the piezoelectric sensors 14, and to apply an offset voltage onto each of the piezoelectric sensors 14 according to the voltage value of each of the piezoelectric sensors 14 as detected, so that the piezoelectric sensors 14 have the same voltage value.

In the curved display device provided by the embodiments of the present disclosure, by arranging the plurality of piezoelectric sensors 14 parallel to each other at the side of at least one of the array substrate and the opposed substrate away from the LC layer, detecting the voltage value of each of the piezoelectric sensors and applying the offset voltage onto each of the piezoelectric sensors according to the voltage value of each of the piezoelectric sensors as detected, the piezoelectric sensors can have the same voltage value and hence have the same stress, which allows the stress on the array substrate or the opposed substrate to be more uniform and mitigates the problem of unevenness of the LC layer.

Figure 1C:
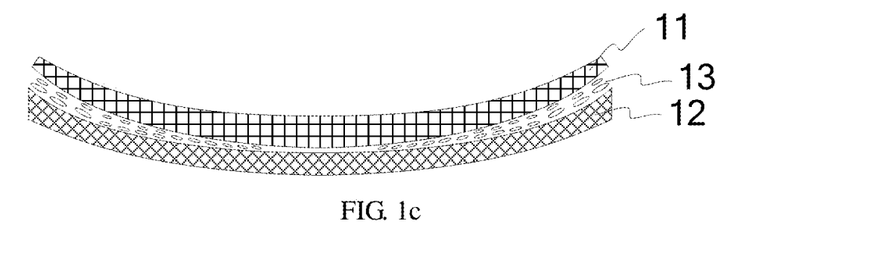

Referring to FIG. 1b, when the curved display device is curved towards the side where the opposed substrate 12 is located, the stress on the array substrate 11 is a tension stress, the stress on the opposed substrate 12 is a compression stress, and a forced direction of the stress is parallel to a plane where the display panel (the array substrate 11 or the opposed substrate 12) is located. As illustrated in FIG. 1c, when the curved display device is curved towards the side where the array substrate 11 is located, the stress on the array substrate 11 is a compression stress, the stress on the opposed substrate 12 is a tension stress, and a forced direction of the stress is parallel to a plane where the display panel is located.

Figure 4:
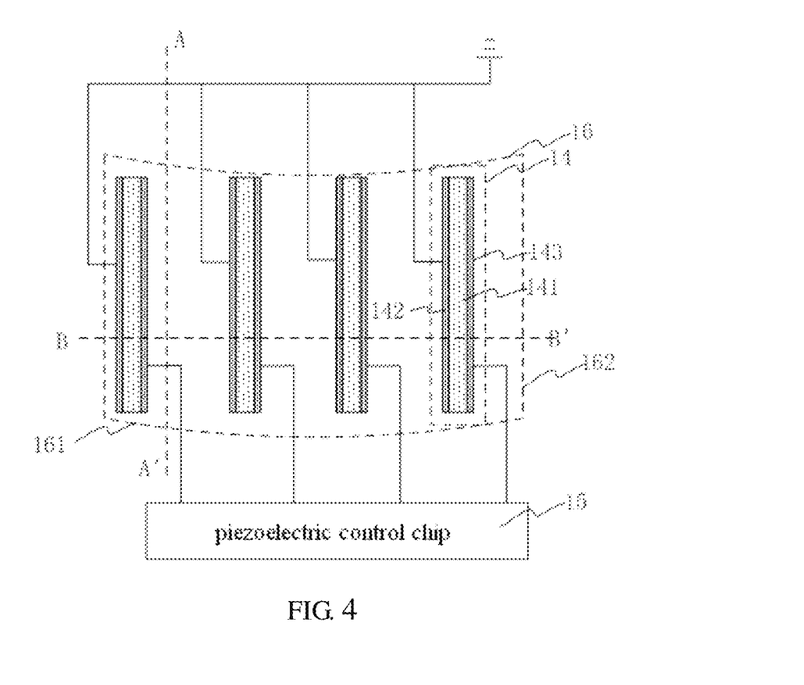
FIG. 4 is a schematic diagram illustrating a electrical signal connection between each of the piezoelectric sensors and a piezoelectric control chip.

FIG. 4 is a distribution diagram of the piezoelectric sensors 14 and the piezoelectric control chip 15 on the array substrate 11 or the opposed substrate 12. Referring to FIG. 4, by taking the case where upper and lower edges of the display region 16 of the curved display device are the curved first edges 161 and left and side edges are the second edges 162 extending along a straight line direction as an example, for each of the straight lines parallel to the extending direction of the second edge 162, the stress is the same for all the positions on the straight line, for example, the stresses at different positions on AA' in the figure are identical with each other. For each of the straight lines parallel to the direction perpendicular to the extending direction of the second edge 162, the stress is changed with the position on the straight line, for example, the stresses at different positions on BB' in the figure are different from each other. Therefore, in order to facilitate the adjustment of stress on the array substrate 11 or the opposed substrate 12, it needs to configure the piezoelectric sensor 14 as a plurality of strip-shaped piezoelectric sensors 14 parallel to each other and allows the extending direction of the piezoelectric sensor 14 to be the same with the extending direction of the second edge 162. In this way, it can adjust the stress on the whole straight line parallel to the extending direction of the second edge 162, which can not only allow the stress on the array substrate 11 or the opposed substrate 12 to be more uniform but also avoids introducing new uneven stress. Additionally, a length of the piezoelectric sensor 14 is the same as a length of the second edge 162.

In the embodiments of the present disclosure, the piezoelectric sensors and the piezoelectric control chip described above can be disposed on one of the array substrate and the opposed substrate, and can also be disposed on both of the array substrate and the opposed substrate. When both of the array substrate and the opposed substrate are provided with the piezoelectric sensors and the piezoelectric control chip, it can adjust the stress on both of the array substrate and the opposed substrate to be uniform, and allows the LC layer to achieve a relatively uniform state. For example, the piezoelectric control chip on the array substrate only controls the piezoelectric sensors on the array substrate, and the piezoelectric control chip on the opposed substrate only controls the piezoelectric sensors on the opposed substrate.

The piezoelectric sensor described above detects a stress at a corresponding position by utilizing piezoelectric effect, and adjusts the stress at the corresponding position by utilizing inverse piezoelectric effect. Hereinafter, the principles of the piezoelectric effect and the inverse piezoelectric effect will be described in conjunction with FIG. 5.

Figure 5:
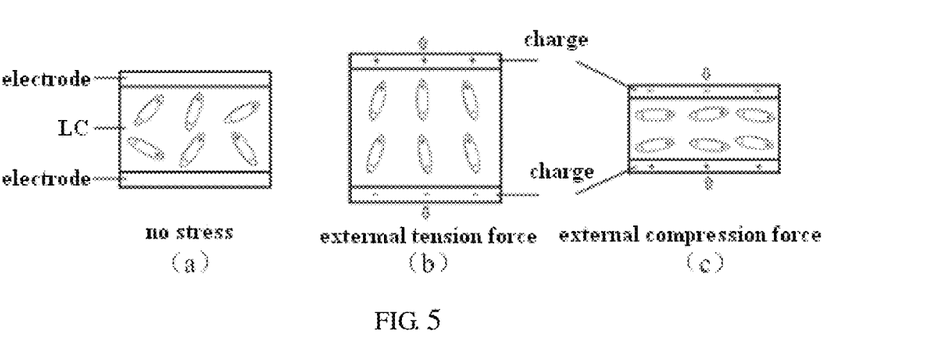
FIG. 5 and FIG. 6 are schematic diagrams illustrating a principle of piezoelectric effect and a principle of inverse piezoelectric effect, respectively.

The piezoelectric effect refers to that, a polarization phenomenon occurs inside a dielectric medium (e.g., a piezoelectric material) when it has a deformation due to an external force in a certain direction, and meanwhile positive and negative charges would be appeared at two opposite surfaces of the dielectric medium. When the external force is removed, the dielectric medium would be restored to an uncharged state. As illustrated in FIG. 5(a), when the piezoelectric material has no stress thereon, no electric charge would be occurred at both ends of the piezoelectric material; as illustrated in FIG. 5(b), when the piezoelectric material is applied with a tension stress in a direction denoted by the arrow in the figure, positive and negative charges appears at two opposite surfaces of the piezoelectric material; as illustrated in FIG. 5(c), when the piezoelectric material is applied with a compression stress in a direction denoted by the arrow in the figure, the positive and negative charges also appears at the two opposite surfaces of the piezoelectric material; furthermore, the polarity of the electric charge changes with the direction of the force. As illustrated in FIG. 5(b) and FIG. 5 (c), a direction of voltage generated by the electric charges in FIG. 5(b) is opposite to that of the voltage generated by the electric charges in FIG. 5(c).

Figure 6:
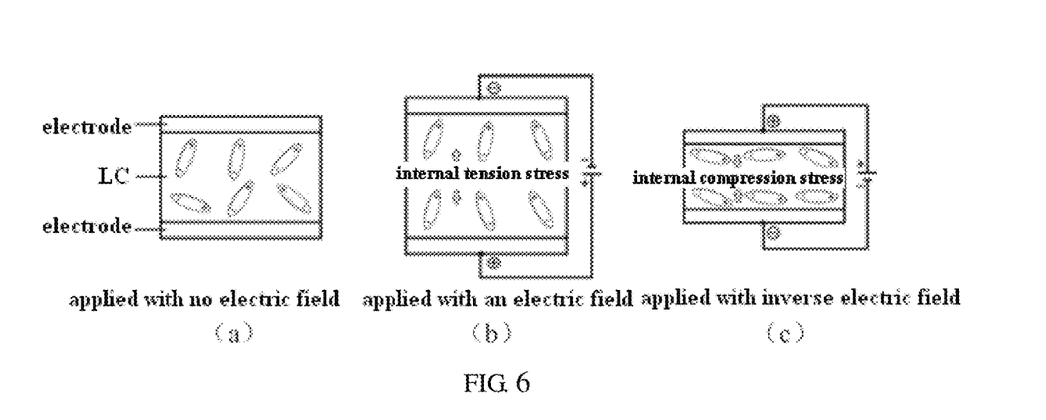

The inverse piezoelectric effect refers to that, when an electric field is applied in a polarized direction of the dielectric medium, the dielectric medium is caused to have a deformation; and when the electric field is removed, the deformation of the dielectric medium disappears accordingly. FIG. 6(a) illustrates the state where no electric field is applied on the piezoelectric material; as illustrated in FIG. 6(b), when the piezoelectric material is applied with a voltage in a certain direction, a tension stress is generated inside the piezoelectric material and causes the piezoelectric material to have an extensional deformation; as illustrated in FIG. 6(c), when the piezoelectric material is applied with a voltage in an opposite direction, a compression stress is generated inside the piezoelectric material and causes the piezoelectric material to have a compression deformation. In particular implementation, when the piezoelectric material is applied with a voltage in a certain direction, whether it's caused to have an tensile deformation or a compression deformation is depending on a property of the piezoelectric material.

For example, the piezoelectric control chip detects the voltage value of each of the piezoelectric sensors, and then obtains a stress value at each of the piezoelectric sensors according to a property of piezoelectric material in the piezoelectric sensors, in combination with the piezoelectric effect. Subsequently, the piezoelectric control chip applies an offset voltage onto each of the piezoelectric sensors according to the voltage value detected at each of the piezoelectric sensors. Due to the inverse piezoelectric effect, upon applying the offset voltage onto the piezoelectric sensor, the stress on the piezoelectric sensor is changed accordingly so that the piezoelectric sensors can have the same voltage value. As a result, all the piezoelectric sensors can be adjusted to have the same stress. By taking the case where five piezoelectric sensors are provided as an example, if the voltage values of the piezoelectric sensors as detected are 3, 4, 5, 4 and 3, respectively, then the offset values at the piezoelectric sensors can be 1, 0 −1, 0 and 1, respectively. Upon adjustment, the piezoelectric sensors can have the same stress.

For example, in the foregoing curved display device provided by the embodiments of the present disclosure, referring to FIG. 3 and FIG. 4, the above-mentioned piezoelectric sensor 14 can include: a piezoelectric film 141; and a grounding electrode 142 and a voltage control electrode 143 which are located at the same layer with the piezoelectric film 141 and are located at two sides of the piezoelectric film 141 respectively.

The grounding electrode 142 of each of the piezoelectric sensors 14 is grounded, and the voltage control electrode 143 of each of the piezoelectric sensors 14 is electrically signal connected with the piezoelectric control chip 15.

The above-mentioned piezoelectric film 141 is made of a piezoelectric material, for example, the piezoelectric material can be piezoelectric crystal, and can also be piezoelectric ceramic. The material of forming the piezoelectric film 141 is not particularly limited herein. Because the forced direction of the stress on the display panel (the array substrate 11 or the opposed substrate 12) is parallel to the plane where the display panel is located, by arranging the grounding electrode 142 and the voltage control electrode 143 in the same layer with the piezoelectric film 141, the adjustment to the stress on the display panel can be achieved. Referring to FIG. 4, the grounding electrode 142 of each of the piezoelectric sensors 14 is grounded, and the voltage control electrode 143 of each of the piezoelectric sensors 14 is electrically signal connected with the piezoelectric control chip 15; in this way, when adjusting the stress, if the stress to be adjusted is a tension stress, then the corresponding offset voltage to be applied is a positive voltage; and if the stress to be adjusted is a compression stress, then the corresponding offset voltage to be applied is a negative voltage. The circuit is simple and the operation is easy.

In order to illustrate the structure of the above-mentioned piezoelectric sensor 14 more clearly, FIG. 3 and FIG. 4 merely depict four piezoelectric sensors 14. In particular implementation, the number of the piezoelectric sensor 14 can be configured as other values according to actual demands and is not particularly limited herein. FIG. 3 illustrates the case where the piezoelectric sensors 14 are disposed on the array substrate 11 by way of example, and the case where the piezoelectric sensors 14 are disposed on the opposed substrate 12 is similar with that in FIG. 3. It only needs to replace the array substrate 11 with the opposed substrate 12, without individually depicting herein.

In particular implementation, the foregoing curved display device provided by the embodiments of the present disclosure can be curved in two manners.

In the first manner, the curved display device is curved towards the side where the opposed substrate 12 is located, as illustrated in FIG. 1b.

The offset voltage corresponding to the piezoelectric sensor 14 located on the array substrate 11 is gradually increased in a direction from a center to an edge of the curved display device.

The offset voltage corresponding to the piezoelectric sensor 14 located on the opposed substrate 12 is gradually decreased in the direction from the center to the edge of the curved display device.

Referring to FIG. 1b, when the curved display device is curved towards the side where the opposed substrate 12 is located, the stress on the array substrate 11 is a tension stress, and the tension stress is gradually decreased in the direction from the center to the edge of the curved display device; in order to allow the stress on the array substrate 11 to be substantially uniform, it needs to apply the array substrate 11 with a tension stress which is gradually increased in the direction from the center to the edge of the curved display device, that is, the offset voltage is gradually increased in the direction from the center to the edge of the curved display device; the stress on the opposed substrate 12 is a compression stress, and the compression stress is gradually decreased in the direction from the center to the edge of the curved display device; in order to allow the stress on the opposed substrate 12 to be substantially uniform, it needs to apply the opposed substrate 12 with a compression stress which is gradually increased in the direction from the center to the edge of the curved display device; moreover, the offset voltage for adjusting the tension stress and the offset voltage for adjusting the compression stress have opposite electric properties, thus the offset voltage applied onto the opposed substrate 12 is gradually decreased in the direction from the center to the edge of the curved display device.

In the second manner, the curved display device is curved towards the side where the array substrate 11 is located, as illustrated in FIG. 1c.

The offset voltage corresponding to the piezoelectric sensor 14 located on the array substrate 11 is gradually decreased in a direction from a center to an edge of the curved display device.

The offset voltage corresponding to the piezoelectric sensor 14 located on the opposed substrate 12 is gradually increased in the direction from the center to the edge of the curved display device.

Referring to FIG. 1c, when the curved display device is curved towards the side where the array substrate 11 is located, the stress on the array substrate 11 is a compression stress, and the compression stress is gradually decreased in the direction from the center to the edge of the curved display device; in order to allow the stress on the array substrate 11 to be substantially uniform, it needs to apply the array substrate 11 with a compression stress which is gradually increased in the direction from the center to the edge of the curved display device, that is, the offset voltage is gradually decreased in the direction from the center to the edge of the curved display device; the stress on the opposed substrate 12 is a tension stress, and the tension stress is gradually decreased in the direction from the center to the edge of the curved display device; in order to allow the stress on the opposed substrate 12 to be substantially uniform, it needs to apply the opposed substrate 12 with a tension stress which is gradually increased in the direction from the center to the edge of the curved display device; as a result, the offset voltage applied onto the opposed substrate 12 is gradually increased in the direction from the center to the edge of the curved display device.

Furthermore, in the foregoing curved display device provided by the embodiments of the present disclosure, it can further include a plurality of spacers located between the array substrate and the opposed substrate.

In the extending direction of the second edge, the spacers have the same height.

In a direction perpendicular to the extending direction of the second edge, the height of the spacer is gradually decreased from the center to the edge of the curved display device.

For each of the straight lines parallel to the extending direction of the second edge, the stress is the same for all the positions on the straight line, thus during curving the array substrate and the opposed substrate, the straight lines parallel to the extending direction of the second edge have the same stress; as a result, the spacers can be configured to have the same height in the extending direction of the second edge. For each of the straight lines parallel to the direction perpendicular to the extending direction of the second edge, the stress is changed with the position on the straight line and is gradually decreased from the middle to both ends; as a result, in the direction perpendicular to the extending direction of the second edge, it can be configured such that, the spacer at the middle has a greater height so as to provide a support function for the array substrate and the opposed substrate and to buffer a part of the stress, the spacer at the edge has a smaller height and provides little buffer function; in this way, the cell thickness of the curved display device is relatively uniform, that is, the thickness of the LC layer is relatively uniform.

Figure 7:
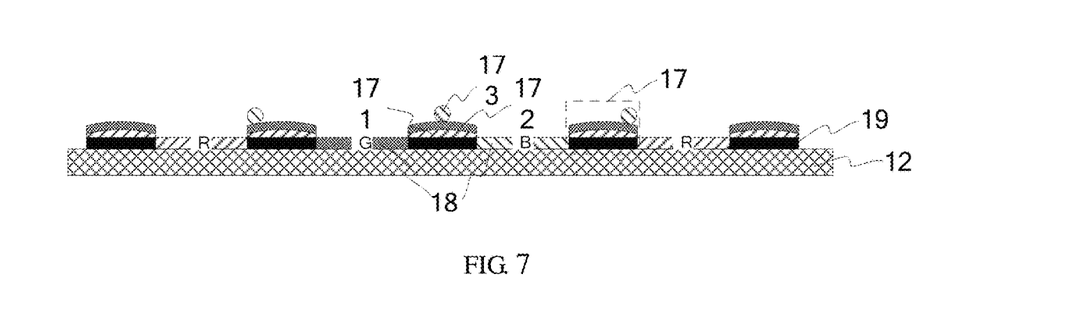
FIG. 7 is a structural diagram illustrating spacers disposed on an opposed substrate.

In particular implementation, in the foregoing curved display device provided by the embodiments of the present disclosure, as illustrated in FIG. 7, the array substrate 11 or the opposed substrate 12 can include: a color filter (CF) layer including sub-pixel color resistances 18 of at least three colors; and a black matrix (BM) 19 configured to separate the sub-pixel color resistances 18.

The piezoelectric sensor 14 and the spacer 17 are disposed in an area where the BM 19 is located.

The spacer 17 is consisted of sub-pixel color resistances 18 of different colors.

FIG. 7 illustrates the case where the CF layer is located on the opposed substrate 12, that is, the opposed substrate 12 is a CF substrate. In practical application, the CF layer can also be located on the array substrate 11. The position of the CF layer is not particularly limited herein. By arranging both of the piezoelectric sensor 14 and the spacer 17 on the area where the BM 19 is located, it can prevent the piezoelectric sensor 14 and the spacer 17 from affecting the aperture ratio. The piezoelectric sensor 14 and the spacer 17 can also be formed of transparent material, without particularly limited herein, as long as it doesn't affect a normal display of the curved display device. Additionally, a conductive wire connecting each of the piezoelectric sensors 14 to the piezoelectric control chip 15 can also be disposed in the area where the BM 19 is located, and the piezoelectric control chip 15 can be disposed in a non-display region.

Referring to FIG. 7, the spacer 17 is consisted of sub-pixel color resistances 18 of different colors, which means that the spacer 17 is consisted of structures located in the same layer with the sub-pixel color resistances 18 of different colors. By taking the case where the CF layer includes sub-pixel color resistances 18 of three colors of red (R), green (G) and blue (B) as an example, the above-mentioned spacer 17 includes: a first convex structure 171 formed by using a process the same as that of the red sub-pixel color resistance 18; a second convex structure 172 formed by using a process the same as that of the green sub-pixel color resistance 18; and a support structure 173 formed by using a process the same as that of the blue sub-pixel color resistance 18. As illustrated in FIG. 7, the pattern of the first convex structure 171 and the pattern of the second convex structure 172 can be substantially the same with that of the BM 19, and the support structure 173 can be configured in such a manner that, in the direction perpendicular to the extending direction of a second edge 162, a distance from the support structure 173 to a center of a corresponding second convex structure 172 is increased with an increase of a distance from the spacer 17 to the center of the curved display device; in this way, the pattern of the spacer 17 can be formed at the same time when manufacturing the CF layer, and spacers 17 with different heights can be obtained, which allows for a more uniform cell thickness of the curved display device. In particular implementation, for achieving different heights of the spacers 17, referring to FIG. 7, several spacers 17 close to the outmost side edge may not be provided with the support structure 173.

In the curved display device provided by the embodiments of the present disclosure, by arranging the plurality of piezoelectric sensors 14 parallel to each other at the side of at least one of the array substrate 11 and the opposed substrate 12 away from the LC layer 13, detecting the voltage value of each of the piezoelectric sensors 14 and applying the offset voltage onto each of the piezoelectric sensors 14 according to the voltage value of each of the piezoelectric sensors 14 as detected, the piezoelectric sensors 14 can have the same voltage value and hence have the same stress, which allows the stress on the array substrate 11 or the opposed substrate 12 to be more uniform and mitigates the problem of unevenness of the LC layer 13. Furthermore, by arranging the spacers 17 with different heights, the thickness of the LC layer 13 can be more uniform.

Embodiments of the present disclosure further provide a manufacturing method of the curved display device described above. The manufacturing method solves the problem based on the principle the same as that of the curved display device described above, and hence can be implemented with reference to the implementations of the curved display device described above, without repeating the details herein.

Figure 8:
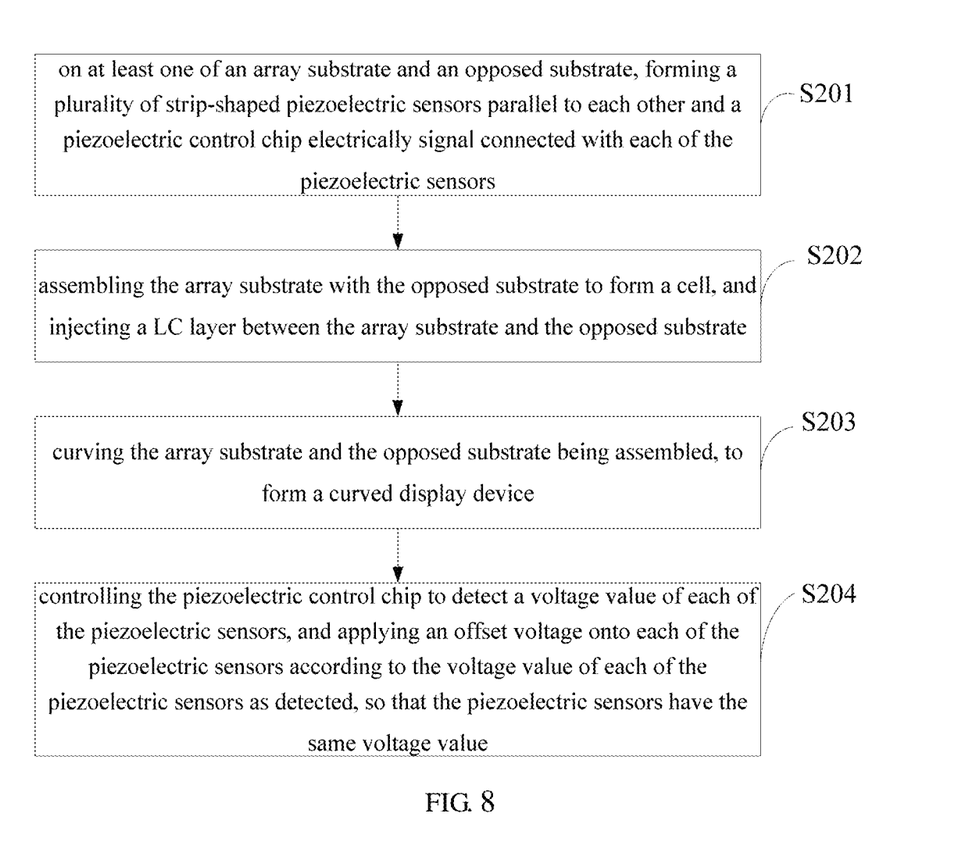
FIG. 8 is a flow chart illustrating a manufacturing method of the above-mentioned curved display device provided by an embodiment of the present discourse.

As illustrated in FIG. 8, the manufacturing method of the foregoing curved display device provided by the embodiments of the present disclosure includes:

Step S201, on at least one of an array substrate and an opposed substrate, forming a plurality of strip-shaped piezoelectric sensors parallel to each other and a piezoelectric control chip electrically signal connected with each of the piezoelectric sensors;

Step S202, assembling the array substrate with the opposed substrate to form a cell, and injecting a LC layer between the array substrate and the opposed substrate;

Step S203, curving the array substrate and the opposed substrate being assembled, to form a curved display device; and Step S204, controlling the piezoelectric control chip to detect a voltage value of each of the piezoelectric sensors, and applying an offset voltage onto each of the piezoelectric sensors according to the voltage value of each of the piezoelectric sensors as detected, so that the piezoelectric sensors have the same voltage value.

According to the manufacturing method of the curved display device provided by the embodiment of the present disclosure, a plurality of strip-shaped piezoelectric sensors parallel to each other and a piezoelectric control chip electrically signal connected with each of the piezoelectric sensors are formed on at least one of an array substrate and an opposed substrate, and upon forming a curved display device, the piezoelectric control chip can be controlled to detect a voltage value of each of the piezoelectric sensors, and each of the piezoelectric sensors can be applied with an offset voltage according to the voltage value of each of the piezoelectric sensors as detected, so that the piezoelectric sensors can have the same voltage value and hence have the same stress, which allows the stress on the array substrate or the opposed substrate to be more uniform and mitigates the problem of unevenness of the LC layer.

In the above-described step S201, the piezoelectric sensor and the piezoelectric control chip are formed on the topmost layer of the array substrate or the opposed substrate, i.e., forming an over coat (OC) on the array substrate or the opposed substrate, and then manufacturing the piezoelectric sensor and the piezoelectric control chip on the OC. In order to avoid affecting the aperture ratio of the curved display device, the piezoelectric sensor is formed in the area where the BM is located and the piezoelectric control chip is formed in the non-display region.

In the above-described step S202, the array substrate and the opposed substrate are assembled to form a cell in such a manner that the side provided with the piezoelectric sensor faces outwards. In the above-described step S203, when forming the curved display device, it can be curved towards the opposed substrate, and can also be curved towards the array substrate, the curved direction is not particularly limited herein. In the above-described step S204, the principle of controlling the piezoelectric control chip to adjust the stress on the array substrate or the opposed substrate is the same as that in the curved display device described above, without repeating the details herein.

Furthermore, in the foregoing manufacturing method provided by the embodiments of the present disclosure, before the above-described step S202, it can further include: forming a plurality of spacers at a side of the array substrate or the opposed substrate away from the piezoelectric sensors, wherein in an extending direction of a second edge of the curved display device to be formed, the spacers have the same height; and in a direction perpendicular to the extending direction of the second edge of the curved display device to be formed, the height of the spacer is gradually decreased in a direction from a center to an edge of the curved display device.

Referring to FIG. 4, for each of the straight lines parallel to the extending direction of the second edge 162, the stress is the same for all the positions on the straight line, thus during curving the array substrate 11 and the opposed substrate 12, the straight lines parallel to the extending direction of the second edge 162 have the same stress; as a result, the spacers 17 can be configured to have the same height in the extending direction of the second edge 162. For each of the straight lines parallel to the direction perpendicular to the extending direction of the second edge 162, the stress is changed with the position on the straight line and is gradually decreased from the middle to both ends; as a result, in the direction perpendicular to the extending direction of the second edge 162, it can be configured such that, the spacer 17 at the middle has a greater height so as to provide a support function for the array substrate 11 and the opposed substrate 12 and to buffer a part of the stress, the spacer 17 at the edge has a smaller height and provides little buffer function; in this way, the cell thickness of the curved display device is relatively uniform, that is, the thickness of the LC layer 13 is relatively uniform.

In practical application, in the foregoing manufacturing method provided by the embodiments of the present disclosure, before forming a plurality of spacers 17 on the array substrate 11 or the opposed substrate 12, it can further include: forming a color filter (CF) layer having sub-pixel color resistances 18 of at least three colors and a black matrix (BM) 19 configured to separate the sub-pixel color resistances 18, on the array substrate 11 or the opposed substrate 12.

Furthermore, in the foregoing manufacturing method provided by the embodiments of the present disclosure, the CF layer can include: a first sub-pixel color resistance 18, a second sub-pixel color resistance 18 and a third sub-pixel color resistance 18.

Referring to FIG. 7, forming the plurality of spacers 17 on the array substrate 11 or the opposed substrate 12 can include: forming a first convex structure 171 on the BM 19 by using a process the same as that of the first sub-pixel color resistance 18; forming a second convex structure 172 on the first convex structure 171 by using a process the same as that of the second sub-pixel color resistance 18; and forming a support structure 173 on the second convex structure 172 by using a process the same as that of the third sub-pixel color resistance 18, wherein in a direction perpendicular to an extending direction of a second edge 162 of the curved display device to be formed, a distance from the support structure 173 to a center of a corresponding second convex structure 172 is increased with an increase of a distance from the spacer 17 to a center of the curved display device.

The spacer 17 described above is formed on the BM 19, so as to prevent the spacer 17 from affecting the aperture ratio. Moreover, various film layers of the spacer 17 are formed by using the same process with that of sub-pixel color resistances 18 of different colors, so that the processing steps of manufacturing the curved display device can be decreased by changing the mask for forming the sub-pixel color resistance 18, which reduces the cost. As illustrated in FIG. 7, the pattern of the first convex structure 171 and the pattern of the second convex structure 172 can be substantially the same with that of the BM 19, and the support structure 173 can be configured in such a manner that, in the direction perpendicular to the extending direction of the second edge 162, a distance from the support structure 173 to a center of a corresponding second convex structure 172 is increased with an increase of a distance from the spacer 17 to the center of the curved display device; in this way, the pattern of the spacer 17 can be formed at the same time when manufacturing the CF layer, and spacers 17 with different heights can be obtained, which allows for a more uniform cell thickness of the curved display device.

Figure 9A:
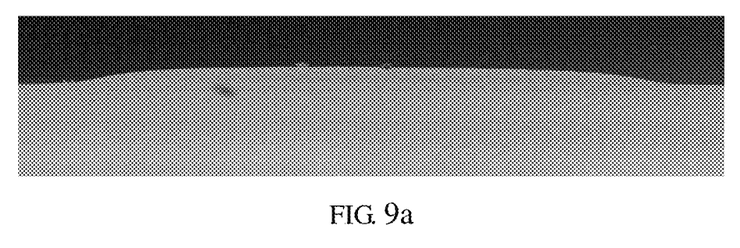
FIG. 9a and FIG. 9b are images of spacers obtained by a scanning electron microscope (SEM).
Figure 9B:
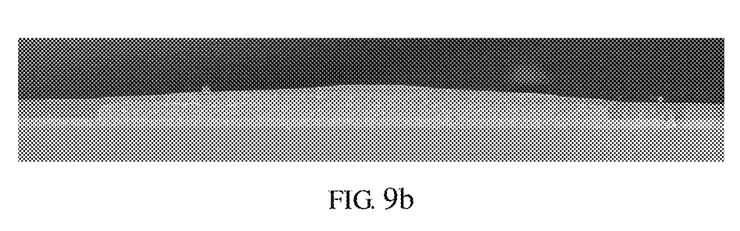

In particular implementation, due to the size of the spacer being relatively smaller, during forming film layers by using the same process with that of sub-pixel color resistances of different colors, and due to factors in terms of size and technology, the film layer as formed may not be absolutely flat but may be a convex structure which is higher at middle and lower at both sides, that is, the pattern of the first convex structure and the second convex structure; it can be formed by using the same process with that of the sub-pixel color resistance, and can also be subjected to further process if the height of the convex structure as formed cannot satisfy the demands. FIG. 9a and FIG. 9b are images of spacers obtained by a scanning electron microscope (SEM). As it can be seen from FIG. 9a and FIG. 9b, film layers of the spacer with a convex shape can be formed by using the same process with that of the sub-pixel color resistances of different colors. As it also can be seen from FIG. 9b, a support structure can be formed on a gentle slope of the second convex structure. As a result, it can obtain such a structure that, in the direction perpendicular to the extending direction of the second edge, a distance from the support structure to a center of a corresponding second convex structure is increased with an increase of a distance from the spacer to a center of the curved display device.

In the curved display device and the manufacturing method thereof provided by the embodiments of the present disclosure, by arranging the plurality of piezoelectric sensors parallel to each other at the side of at least one of the array substrate and the opposed substrate farther from the LC layer, detecting the voltage value of each of the piezoelectric sensors and applying the offset voltage onto each of the piezoelectric sensors according to the voltage value of each of the piezoelectric sensors as detected, the piezoelectric sensors can have the same voltage value and hence have the same stress, which allows the stress on the array substrate or the opposed substrate to be more uniform and mitigates the problem of unevenness of the LC layer. Moreover, by arranging the spacers with different heights, the thickness of the LC layer can be more uniform.

The present disclosure possesses beneficial effects as below.

In the curved display device and the manufacturing method thereof provided by the embodiments of the present disclosure, the curved display device includes: an array substrate and an opposed substrate disposed opposite to each other; and a liquid crystal (LC) layer located between the array substrate and the opposed substrate, wherein one side of at least one of the array substrate and the opposed substrate away from the LC layer is provided with a plurality of strip-shaped piezoelectric sensors parallel to each other and a piezoelectric control chip electrically signal connected with each of the piezoelectric sensors; a display region of the curved display device includes: two curved first edges and two second edges extending along a straight line direction; an extending direction of each of the piezoelectric sensors is the same as an extending direction of the second edge; the piezoelectric control chip is configured to detect a voltage value of each of the piezoelectric sensors, and to apply an offset voltage onto each of the piezoelectric sensors according to the voltage value of each of the piezoelectric sensors as detected, so that the piezoelectric sensors can have the same voltage value. By arranging the plurality of strip-shaped piezoelectric sensors parallel to each other at one side of at least one of the array substrate and the opposed substrate away from the LC layer, detecting the voltage value of each of the piezoelectric sensors and applying the offset voltage onto each of the piezoelectric sensors according to the voltage value of each of the piezoelectric sensors as detected, the piezoelectric sensors can have the same voltage value and hence have the same stress, which allows the stress on the array substrate or the opposed substrate to be more uniform and mitigates the problem of unevenness of the LC layer.

The above are merely specific implementations of the present disclosure without limiting the protection scope of the present disclosure thereto. The protection scope of the present disclosure should be based on the protection scope of the appended claims.

What is claimed is:

1. A curved display device, comprising: an array substrate and an opposed substrate opposite to each other; and a liquid crystal (LC) layer located between the array substrate and the opposed substrate, wherein
one side of at least one of the array substrate and the opposed substrate away from the LC layer is provided with a plurality of piezoelectric sensors and a piezoelectric control chip electrically signal connected with each of the piezoelectric sensors;
the piezoelectric control chip is configured to detect a voltage value of each of the piezoelectric sensors and to apply an offset voltage onto each of the piezoelectric sensors according to the voltage value of each of the piezoelectric sensors as detected, so that the piezoelectric sensors have a same voltage value.

2. The curved display device according to claim 1, wherein the plurality of piezoelectric sensors are a plurality of strip-shaped piezoelectric sensors,
a display region of the curved display device comprises: two curved first edges and two second edges extending along a straight line direction; an extending direction of each of the piezoelectric sensors is the same as an extending direction of the second edges.

3. The curved display device according to claim 2, wherein the piezoelectric sensor comprises: a piezoelectric film; and a grounding electrode and a voltage control electrode which are located at a same layer with the piezoelectric film and are located at two sides of the piezoelectric film, respectively;
the grounding electrode of each of the piezoelectric sensors is grounded, and the voltage control electrode of each of the piezoelectric sensors is electrically signal connected to the voltage control chip.

4. The curved device according to claim 3, wherein the grounding electrode and the voltage control electrode are located on two sides of the piezoelectric film opposite to each other in a direction perpendicular to the extending direction of the second edges.

5. The curved display device according to claim 3, wherein the curved display device is curved towards a side where the opposed substrate is located;
the offset voltage corresponding to the piezoelectric sensors located on the array substrate is gradually increased in a direction perpendicular to the extending direction of the second edges from a center to an edge of the curved display device; and
the offset voltage corresponding to the piezoelectric sensors located on the opposed substrate is gradually decreased in the direction perpendicular to the extending direction of the second edges from the center to the edge of the curved display device.

6. The curved display device according to claim 3, wherein the curved display device is curved towards a side where the array substrate is located;
the offset voltage corresponding to the piezoelectric sensors located on the array substrate is gradually decreased in a direction perpendicular to the extending direction of the second edges from a center to an edge of the curved display device; and
the offset voltage corresponding to the piezoelectric sensors located on the opposed substrate is gradually increased in the direction perpendicular to the extending direction of the second edges from the center to the edge of the curved display device.

7. The curved display device according to claim 2, further comprising: a plurality of spacers located between the array substrate and the opposed substrate;
in the extending direction of the second edge, the spacers have a same height; and in a direction perpendicular to the extending direction of the second edge, the height of the spacers is gradually decreased in a direction from a center to an edge of the curved display device.

8. The curved display device according to claim 7, wherein the array substrate or the opposed substrate comprises: a color filter (CF) layer including sub-pixel color resistances of at least three colors; and a black matrix (BM) configured to separate the sub-pixel color resistances;
the piezoelectric sensors and the spacers are in an area where the BM is located; and
the spacers are consisted of sub-pixel color resistances of different colors.

9. The curved display device according to claim 7, wherein each of the spacers includes a first convex structure and a second convex structure stacked with each other and a support structure on the second convex structure,
a distance from the support structure to a center of the second convex structure of a corresponding spacer is increased with an increase of a distance from the spacer to the center of the curved display device.

10. The curved display device according to claim 9, wherein the first convex structure, the second convex structure and the support structure are made of color resistances of different colors.

11. A manufacturing method of a curved display device, comprising:
on at least one of an array substrate and an opposed substrate, forming a plurality of strip-shaped piezoelectric sensors parallel to each other and a piezoelectric control chip electrically signal connected with each of the piezoelectric sensors;
assembling the array substrate with the opposed substrate to form a cell, and injecting a liquid crystal (LC) layer between the array substrate and the opposed substrate;
curving the array substrate and the opposed substrate assembled, to form a curved display device; and
controlling the piezoelectric control chip to detect a voltage value of each of the piezoelectric sensors, and applying an offset voltage onto each of the piezoelectric sensors according to the voltage value of each of the piezoelectric sensors as detected, so that the piezoelectric sensors have a same voltage value.

12. The manufacturing method according to claim 11, wherein before assembling the array substrate with the opposed substrate to form a cell, further comprising:
forming a plurality of spacers at a side of the array substrate or the opposed substrate away from the piezoelectric sensors, wherein
in an extending direction of a second edge of the curved display device to be formed, the spacers have a same height; and
in a direction perpendicular to the extending direction of the second edge of the curved display device to be formed, the height of the spacer is gradually decreased in a direction from a center to an edge of the curved display device.

13. The manufacturing method according to claim 12, wherein the second edge extends along a straight line direction.

14. The manufacturing method according to claim 12, wherein before forming a plurality of spacers on the array substrate or the opposed substrate, further comprising:
forming a color filter (CF) layer consisted of sub-pixel color resistances of at least three colors and a black matrix (BM) configured to separate the sub-pixel color resistances, on the array substrate or the opposed substrate.

15. The manufacturing method according to claim 14, wherein the CF layer comprises: a first sub-pixel color resistance, a second sub-pixel color resistance and a third sub-pixel color resistance;
forming a plurality of spacers on the array substrate or the opposed substrate particularly comprises:
forming a first convex structure on the BM by using a process the same as that of the first sub-pixel color resistance;
forming a second convex structure on the first convex structure by using a process the same as that of the second sub-pixel color resistance; and
forming a support structure on the second convex structure by using a process the same as that of the third sub-pixel color resistance, wherein
in the direction perpendicular to the extending direction of the second edge of the curved display device to be formed, a distance from the support structure to a center of a corresponding second convex structure is increased with an increase of a distance from the spacer to the center of the curved display device.

* * * * *